United States Patent [19]

Fossel et al.

[11] 4,409,550

[45] Oct. 11, 1983

[54] NMR SODIUM IMAGES

[75] Inventors: Eric T. Fossel, West Newton; Jean L. Delayre, Quincy, both of Mass.

[73] Assignee: President and Fellows of Harvard College, Cambridge, Mass.

[21] Appl. No.: 264,100

[22] Filed: May 15, 1981

[51] Int. Cl.³ ............................................. G01N 27/00
[52] U.S. Cl. ...................................... 324/300; 324/309
[58] Field of Search ................ 324/300, 307, 309, 310

[56] References Cited

U.S. PATENT DOCUMENTS 4,354,499 10/1982 Damadian ........................... 324/309

OTHER PUBLICATIONS

Fossel et al., Proc. Natl. Acad. Sci. USA, vol. 6, pp. 3654-3658.
Minkoff et al., "Field-Focusing Nuclear Magnetic Resonance," 1978, pp. 250-252, Naturwissenschaften 65.
Van Geet et al., "Sodium Determination by NMR Spectroscopy," Analytical Chemistry, vol. 47, No. 8, Jul. 1975, pp. 1448, 1449.

*Primary Examiner*—Michael J. Tokar

[57] ABSTRACT

Apparatus for producing a sodium NMR image of sodium-containing biological tissue including an NMR pulse spectrometer capable of providing a plurality of simultaneous observation pulses and changing magnetic field gradients in order to produce an image, and sodium-23 nucleus selector means connected to said spectrometer.

6 Claims, 10 Drawing Figures

NMR SODIUM IMAGES

This invention relates to the use of nuclear magnetic resonance (NMR) spectroscopy to measure chemical entities in biological tissues.

NMR spectroscopy has been used for many years to provide information about the structure of organic compounds. The technique is based on the theory that the nuclei of hydrogen atoms possessing magnetic moments can be aligned either with, or against, that field. Electromagnetic energy passed through the compound can, if at the proper frequency, (the nuclear resonant frequency) be absorbed, changing the magnetic moment alignment of some of the nuclei. The frequency at which absorbance occurs for hydrogen nuclei existing in different environments within a compound provides structural and environmental information about the compound.

Over the past few years, several examples of high-resolution (mm) NMR images of protruding appendages of the human body, notably limbs and heads have been published. Steady technological progress is being made and NMR images of cross sections of the human torso may soon have resolution comparable to that now obtained for heads and limbs. It is important and timely that methods for using NMR imaging as a non-invasive diagnostic modality in cardiovascular research be developed.

A further recent advance in biologically-oriented NMR technology is the use of NMR to measure chemical entities in dynamic systems, such as a beating heart. Such a method is described in Fossel et al. (1980) P.N.A.S. USA 6, 3654.

In order to optimally use NMR technology for imaging in biological systems, static or dynamic, it would be desirable to provide contrast between tissue and blood. Proton NMR images based on proton density alone may often provide little contrast between blood and surrounding tissues.

The present invention takes advantage of the significant difference in sodium concentration between blood and healthy tissue, providing sodium-23 NMR images of sodium-containing biological tissues. When used in conjunction with cardiac tissue, for example, such images provide a negative image of the myocardium, since healthy tissue has low sodium content compared to blood.

The apparatus of the present invention includes an NMR pulse spectrometer capable of providing a plurality of observation pulses and changing magnetic field gradients in order to produce an image, and sodium-23 nucleus selector means connected to the spectrometer.

The tissue in which sodium images are produced using the apparatus of the invention can be any tissue containing sodium, either static tissue or tissue capable of mechanical, electrical pressure or metabolic fluctuation.

The types of fluctuating tissue in which the present invention can prove useful include the beating heart, skeletal muscle, smooth muscle-containing internal organs such as the peristaltic portions of the digestive tract, and tissues, e.g. the lungs, involved in breathing.

Preferably, the apparatus of the invention includes three first order shim coils for changing the magnetic field. An image is produced by generating a group (e.g., 320) of observation pulses when the x and y coils are at a given setting, to produce one projection. The settings are then changed, another group of pulses are generated, and the process is repeated a number (e.g., 12) of times, to produce multiple projections making up an image.

When imaging a tissue having a fluctuating physical characteristic, the apparatus of the invention further includes sensing means for sensing the physical characteristic and providing an output signal, and triggering means responsive to the sensing means output signal and connected to the spectrometer for triggering the spectrometer to produce the observation pulses at a selected point in the course of the fluctuations of the physical characteristic of the tissue.

Apparatus for measuring a chemical entity in living tissue having a cyclical physical characteristic is as described above, with the triggering means being capable of triggering the spectrometer to produce the observation pulse at a selected point in the cycle of the physical characteristic of the tissue.

In preferred embodiments, when a fluctuating tissue is used, the triggering means further includes time delay means for triggering the spectrometer to produce the observation pulses after a predetermined time delay following the receipt of the sensing means output signal.

In another preferred embodiment for use with a tissue having a cyclical physical characteristic, the triggering means further includes multiple pulse means for triggering the spectrometer to produce a plurality of groups of observation pulses within one cycle in order to obtain multiple image within a single cycle. Information is thus provided relating points in the cycle of the physical characteristic with changes in the NMR sodium image of the tissue.

When imaging a fluctuating tissue, a fluctuating physical characteristic can be indicated in any suitable manner. For example, systole in the cardiac cycle can be indicated by a pressurewave, or by the QRS complex of the electrocardiogram.

For the purpose of fully describing the invention, reference is now made to the following detailed description of a preferred embodiment thereof, taken together with the accompanying drawings, wherein FIG. 1 is a diagrammatic representation of perfusion apparatus associated with a beating heart;

The following specific example is intended to more fully illustrate the present invention, without acting as a limitation upon its scope.

EXAMPLE

For this experiment, a high-resolution Nicolet widebore NT 36-spectrometer (8.45 T) was modified so that it would perform as an imaging instrument. This involved the addition of three computer-controlled digital-to-analog-converters to vary the current of the first order gradient shim coils, and the composition of several routines to provides these controls during acquisition of NMR data as well as to obtain data which was used for the reconstruction and display of images. The imaging method used was basically the projection reconstruction method described in Lauterbur (1973) Nature 242, 190, with the image plane defined by an adaptation of the z-gradient oscillation method.

Figure 1:
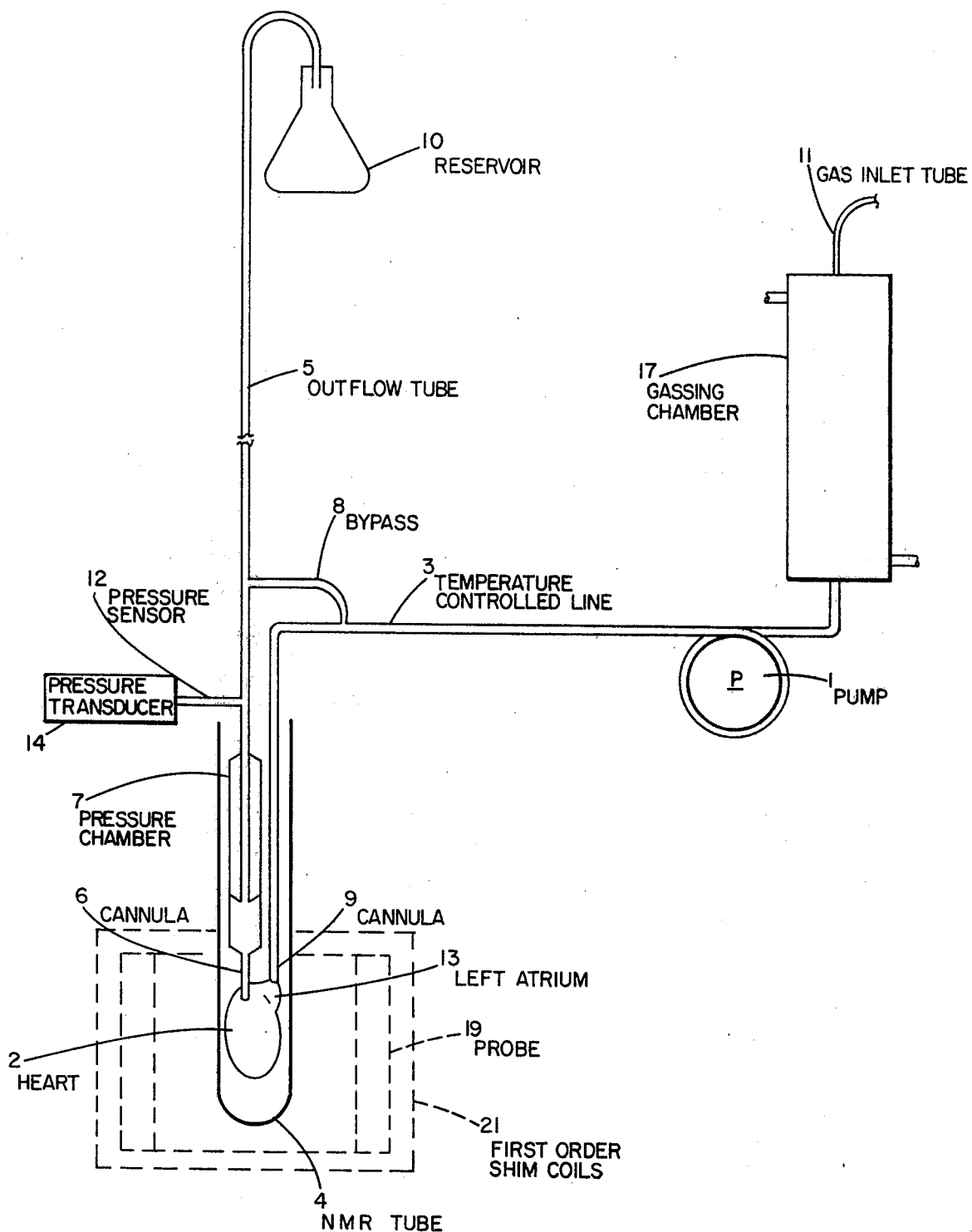

Referring to FIG. 1, heart 2 was obtained from a heparinized Sprague-Dawley rat which had been anesthetized with intraperitoneally-administered Nembutal (10 mg/100 g of body weight). To perform the excision, the rat's diaphragm was transected, incisions was made along both sides of the rib cage, and the anterior chest wall wsa folded back. The heart was excised and dropped into a beaker containing isotonic NaCl at 2° C.

The heart was then transferred to glass NMR tube 4, of outer diameter of 15 mm. All of the remaining apparatus shown in FIG. 1 was constructed of plastic. A cannula 6 was inserted throught the aorta and the heart was washed out for 10 minutes, at 100 cm $H_2O$ pressure with Krebs Henseleit bicarbonate buffer (pH 7.4) supplemented with 11 mM glucose. During the preliminary perfusion, the atrial and aortic outflow 5 were clamped, and bypass 8 was open.

After the 10 minute washout, the left atrium 13 was cannulated with suction cannula 9, which was raised so that the level of perfusate in the NMR tube was above the heart. The presence of the high-sodium perfusate external to the heart provided contrast to the ventricular wall. Heart work was begun by unclamping this cannula 9 and aortic outflow 5 and clamping bypass 8. Variable-speed peristaltic pump 1 was adjusted to provide the desired left atrial filling pressure or cardiac output, and the diameter of aortic outflow tube 5 was adjusted to achieve the desired aortic pressure. Pump 1 delivered 37° C. oxygenated buffer from gassing chamber 17, including gas inlet tube 11, through jacketed temperature control line 3 to the left atrium. Perfusate entering the atrium passed into the left ventricle, and ventricular contraction force fluid into the pressure chamber (*Windkessel*) 7, which contained air to provide pressure compliance. Pressure from ventricular contraction forced fluid through aortic outflow tube 5 to reservoir 10, 70–150 cm above the heart. Fluid was removed from NMR tube 4 by a vacuum tube (not shown) positioned below the heart. Cardiac work was controlled by varying the left ventricle filling pressure, or outflow resistance, or both.

Heart 2, in NMR tube 4, was placed within probe 19 which contained a radio frequency coil, not specifically shown. Probe 19 was surrounded by first order shim coils 21, which were connected to shim coil power supply 33 (part of spectrometer 22), which in turn was connected to analog-to-digital converter 36, controlled by computer 26.

Figure 2:
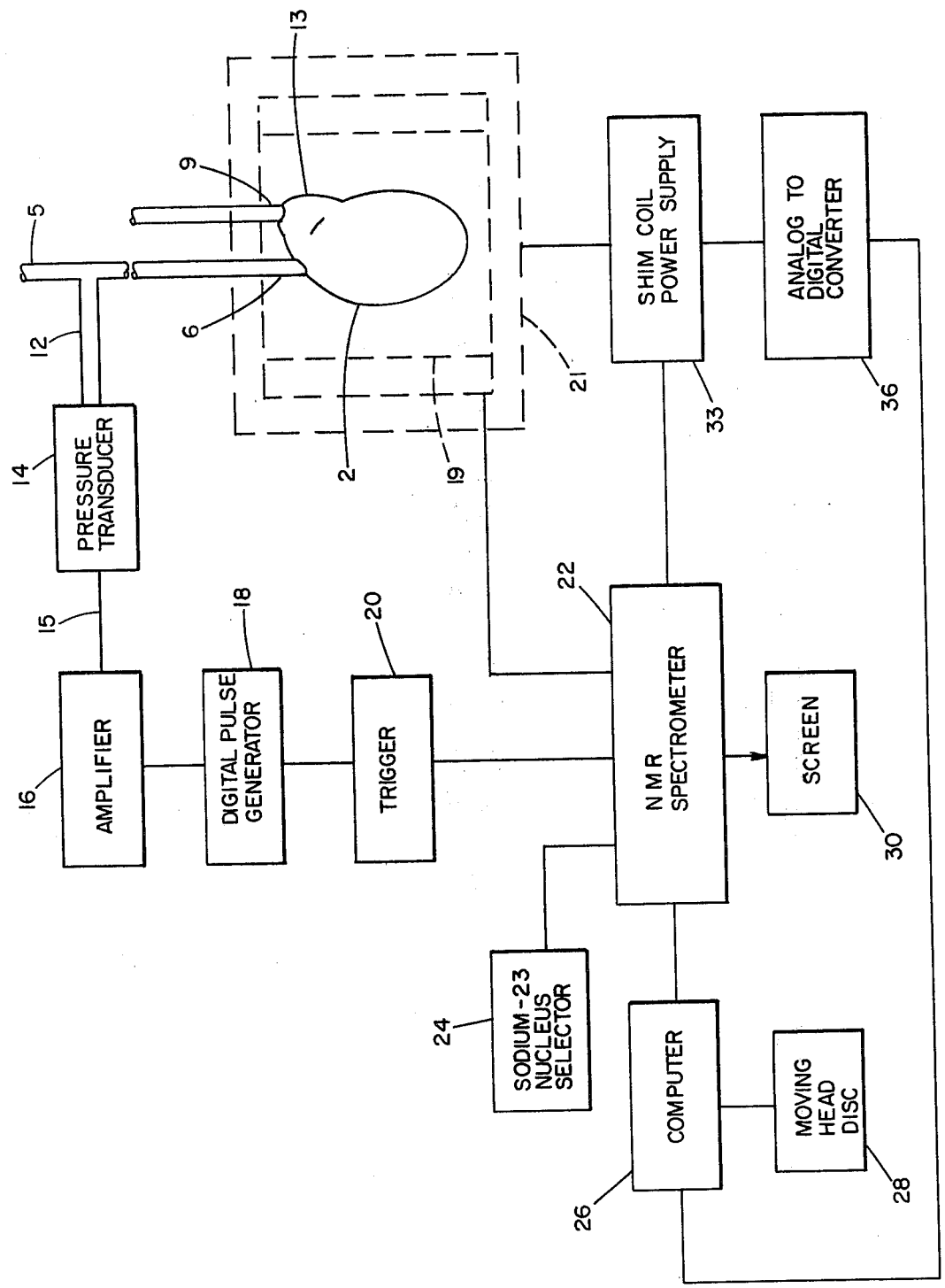
FIG. 2 is a block diagram of NMR apparatus useful in practicing the invention.

One end of hollow, saline-filled tubular pressure sensor 12 was sealed and connected to aortic outflow tube 5. The other end of sensor 12 was connected to Hewlett Packard Model 1280 pressure transducer 14, which in turn (referring to FIG. 2) was connected to Hewlett Packard Model 1064 C amplifier 16. Amplifier 16 was connected to digital pulse generator 18, which included a timing box, a one-shot multivibrator, and a Schmitt trigger.

Digital pulse generator 18 was connected to pulse trigger 20, which in turn was connected to NMR spectrometer 22, which had sodium-23 nucleus selector 24 connected to it, and which was interfaced with Nicolet BNC-12 computer 26 and a Diablo moving head disc 28.

Figure 3:
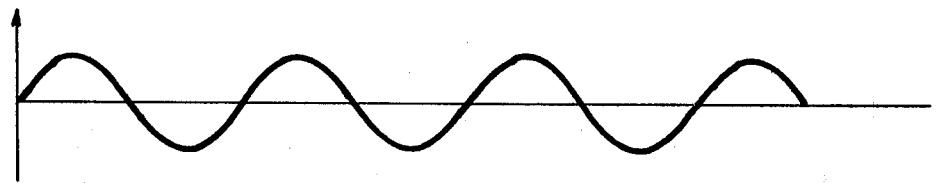
FIG. 3 is a waveform diagram of the fluctuating aortic pressure detected by transducer 14 of FIG. 2.

Pressure transducer 14 converted the fluctuating aortic pressure from the heart into the analog electrical signals shown diagrammatically in FIG. 3. These signals were amplified in amplifier 16, which also sensed the maximum pressure of each cardiac cycle. The amplified signals were then transmitted to digital pulse generator 18, which was programmable so that a time delay of any desired, predetermined length could be provided between the time of sensing of the maximum systolic heart beat and the triggering of the observation pulses, permitting a highly reproducible repetitive initiation of the NMR pulse at any position in the cardiac cycle. In the present example, gated observation pulse groups were produced at four points on the cardiac cycle: systole, diastole, mid-diastole, and mid-systole.

Figure 4:
FIG. 4 is a digital pulse diagram corresponding to the waveform diagram of FIG. 3.
Figure 5:
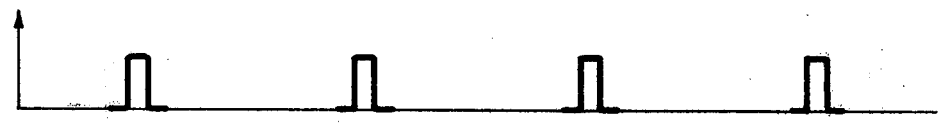
FIG. 5 is a timing diagram of the trigger pulses transmitted from pulse trigger 20 to spectrometer 22 of FIG. 1.

At each predetermined time interval following maximum cardiac pressure, digital pulse generator 18 transmitted a digital pulse to NMR pulse trigger 20; the digital pulses shown in FIG. 4 are shown transmitted at systole, i.e., after a time interval of essentially zero. NMR pulse trigger 20 then transmitted corresponding digital signals, shown in FIG. 5, to NMR spectrometer 22. The radiofrequency of the pulses of 95.24 $MH_2$, was predetermined by sodium-23 nucleus selector 24. The pulses were 20 microsecond pulses.

Figure 6:
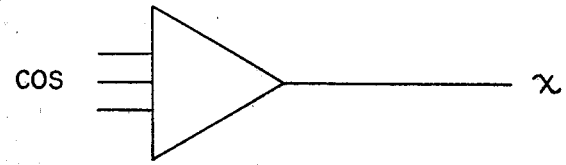
FIG. 6 is a schematic representation of three digital-to-analog converters of the NMR apparatus of FIG. 2.

FIG. 6 is a schematic representation of digital-analog converter 36, containing the three digital-to-analog converters of NMR spectrometer 22 for providing simultaneous current variation to the first order shim coils 21.

As is shown in FIG. 6, three different signals, one for each coil, are generated in converter 36 for transmission to the first order shim coils 21. The first two signals define the angle of projection to be obtained, while the third, a saw-tooth waveform, is perpendicular to the first two and is a free-oscillating gradient.

Figure 7:
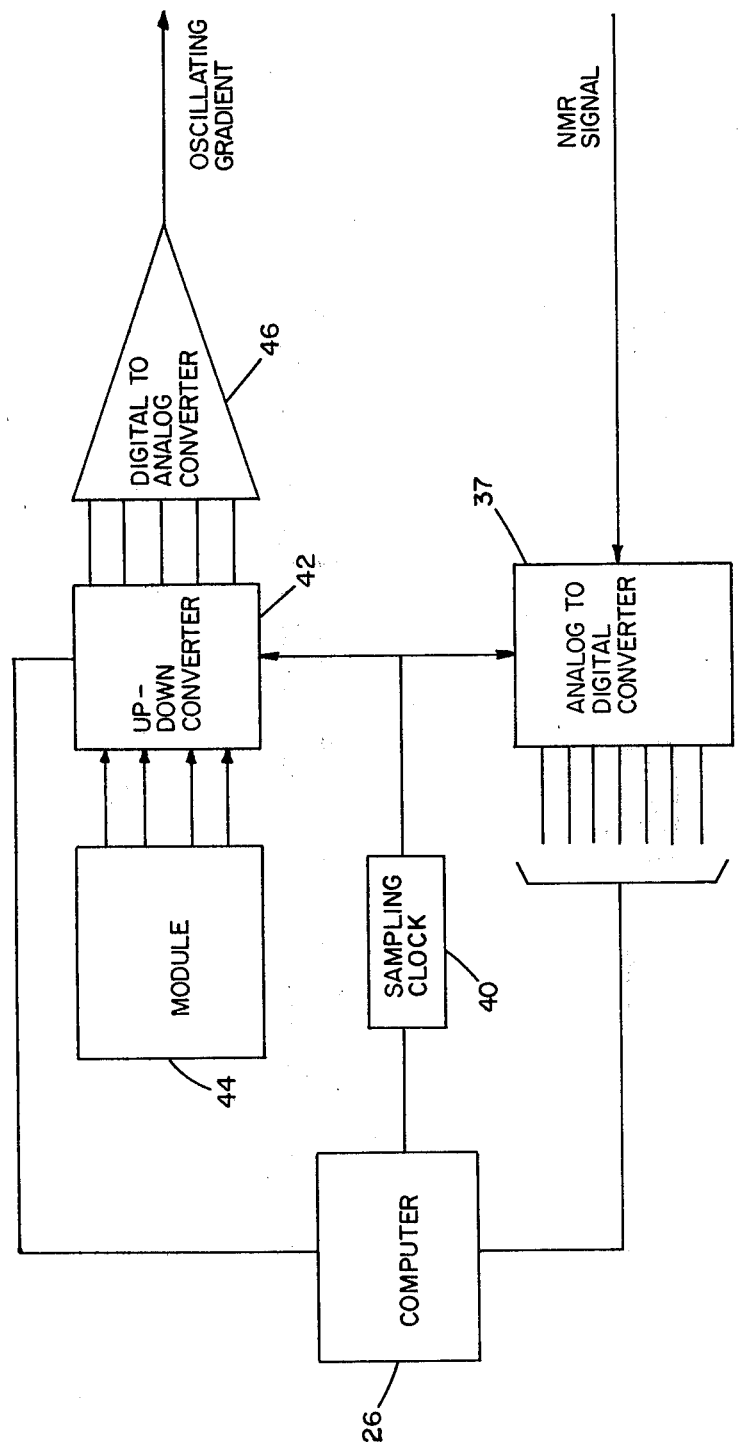
FIG. 7 is a schematic illustration of the generation of the saw-tooth waveform of FIG. 6.

Referring to FIG. 7, which illustrates circuitry which does not form a part of the present invention, the third, saw-tooth waveform provides synchronized oscillating gradients as follows. Analog-to-digital converter 37, of the NMR spectrometer, controlled by computer 26, is connected to and triggered by sampling clock 40, which also serves as the clock for up-down counter 42. Up-down counter 42 is preset at a value, stored in storage module 44, chosen so that the sweep always starts at the same position. The up-down counter transmits digital signals to digital-analog converter 46, which generates the saw-tooth waveform of FIG. 6. That waveform has no relationship to the acquisition of data, and modulates the current of the oscillating gradient.

Figure 8:
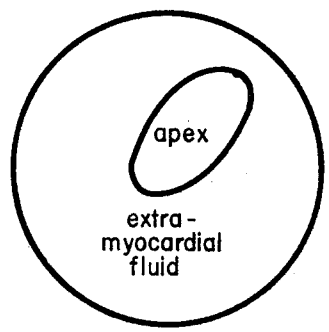
FIG. 8 is a diagrammatic representation of a sodium image at the apex level of a heart.
Figure 9:
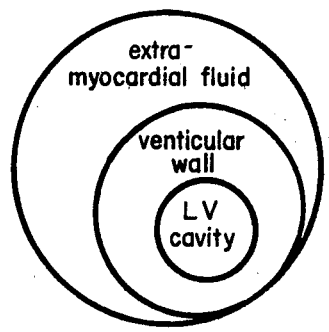
FIG. 9 is a diagrammatic representation of a sodium image at the mid-ventricular level of the heart.

The gated mid-verticular slice spectral images of the working heart produced by NMR spectrometer were displayed on the screen 30 of a Hewlett-Packard 1304A. The images were reconstructed from 12 projections, each projection resulting from averaging 320 pulses (free—inducation decays). Since the spin-lattice relaxation time of sodium is short (approx. 40 msec) in tissue, acquisitions can be closely spaced. One FID can be collected during each heart-beat (approx. 230 msec). Thus each image required about 15 min. of data aquisition. In order to test the planar selectivity, a plane 5 mm lower (i.e., at the apex of the heart) was imaged exactly as was the mid-ventricular plane. FIG. 8 is a diagrammatic representation of the image at this level, and FIG. 9 is a diagrammatic representation of the mid-ventricular slice.

The thickness of the mid-ventricular slice was established experimentally by use of a phantom consisting of a flat-bottom NMR tube with a thin layer (1 mm) of 100 mM NaCl on the bottom. By moving this phantom in the probe with the oscillating z-gradient, the slice thickness was found to be about 1.5 mm.

Figure 10:
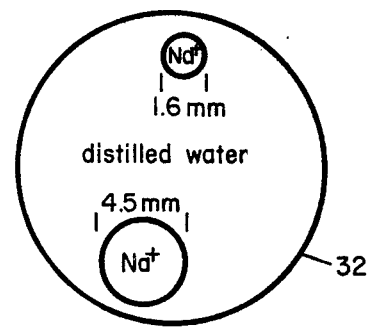
FIG. 10 is a diagrammatic representation of a sodium image of a phantom.

The image-producing system was validated by making sodium-23 images of phantoms. FIG. 10 shows a diagram of the cross section of a phantom consisting of a 20 mm OD NMR tube 32 filled with distilled water into which were placed 5 mm and 2 mm OD tubes containing 145 mM NaCl. The sodium-32 NMR image of this phantom (obtained at 95.24 MHz) resulted from 12 projections in the x-y plane and was reconstructed by the standard back-projection method. Each projection required averaging of 320 free-induction decays.

Various modifications of the invention, within the spirit thereof and the scope of the appended claims, will occur to those skilled in the art.

What is claimed is:

1. Apparatus for producing a sodium NMR image of sodium-containing biological tissue having a physical characteristic capable of fluctuation, said apparatus comprising an NMR pulse spectrometer capable of providing a plurality of observation pulses and changing magnetic field gradients for producing an image,
   sodium-23 nucleus selector means connected to said spectrometer,
   sensing means for sensing said physical characteristic and providing an output signal, and
   triggering means responsive to said sensing means output signal and connected to said spectrometer for triggering said spectrometer to produce said observation pulses at a selected point in the course of said fluctuation of said physical characteristic of said tissue.

2. The apparatus of claim 1 wherein said tissue is a heart.

3. The apparatus of claim 1 wherein said triggering means further includes time delay means for triggering said spectrometer to produce said observation pulses after a predetermined time delay following receipt of said sensing means output signal.

4. The apparatus of claim 1 wherein said fluctuation comprises repetition of a cycle and said triggering means further includes multiple pulse means for triggering said spectrometer to produce a plurality of groups of said observation pulses within one said cycle, whereby information is provided relating points in said cycle with changes in the NMR sodium image of said tissue.

5. The apparatus of claim 2 wherein said fluctuation is the cardiac cycle and said selected point in the course of said fluctuation is systole, which is indicated by a pressure wave.

6. The apparatus of claim 2 wherein said observation pulses are produced at systole and diastole.

* * * * *

UNITED STATES PATENT AND TRADEMARK OFFICE
CERTIFICATE OF CORRECTION

PATENT NO. : 4,409,550
DATED : Oct. 11, 1983
INVENTOR(S) : Eric T. Fossel, et al.

It is certified that error appears in the above-identified patent and that said Letters Patent is hereby corrected as shown below:

Column 1, insert before line 4:
--This invention was made with Government support in the form of NIH Grant No. 1 R01HL22542 and the Government has certain rights in the invention.--

Signed and Sealed this

Twenty-fifth Day of June 1985

[SEAL]

Attest:

DONALD J. QUIGG

Attesting Officer

Acting Commissioner of Patents and Trademarks